(12) United States Patent
Chen

(10) Patent No.: US 6,505,954 B2
(45) Date of Patent: Jan. 14, 2003

(54) SAFE LIGHT EMITTING DEVICE

(75) Inventor: Yen-Cheng Chen, Hsinchu (TW)

(73) Assignee: Excellence Opto. Inc., Hsinchu (TW)

( * ) Notice: Subject to any disclaimer, the term of this patent is extended or adjusted under 35 U.S.C. 154(b) by 0 days.

(21) Appl. No.: 09/881,704

(22) Filed: Jun. 18, 2001

(65) Prior Publication Data

US 2002/0191393 A1 Dec. 19, 2002

(51) Int. Cl.[7] .............................................. F21V 33/00
(52) U.S. Cl. ...................... 362/234; 362/276; 362/800; 315/185 R; 315/185 S
(58) Field of Search .......................... 362/21, 276, 234, 362/227, 800; 315/119, 193, 120, 121, 122, 123, 125, 126, 185 S, 185 R

(56) References Cited

U.S. PATENT DOCUMENTS

| | | | | |
|---|---|---|---|---|
| 4,211,955 A | * | 7/1980 | Ray | 313/500 |
| 4,223,248 A | * | 9/1980 | Tong | 315/185 S |
| 5,313,289 A | * | 5/1994 | Nagane et al. | 358/475 |
| 5,931,570 A | | 8/1999 | Yamuro | |
| 5,994,845 A | * | 11/1999 | Gibboney, Jr. | 315/185 R |

FOREIGN PATENT DOCUMENTS

WO     WO 00/13469     * 3/2000

* cited by examiner

*Primary Examiner*—Sandra O'Shea
*Assistant Examiner*—Hargobind S. Sawhney
(74) *Attorney, Agent, or Firm*—Greenblum & Bernstein, P.L.C.

(57) ABSTRACT

The present invention provides a safe light emitting device that can avoid danger of explosion and fire whenever over current or over voltage occurs. The light emitting device includes a plurality of light emitting diode lamps in series. At least one of the light emitting diode lamps is a safe light emitting diode lamp. The safe light emitting diode lamp results in a broken circuit when either over current or over voltage in the light emitting device occurs. Through the incorporation of the safe light emitting diode lamp, the series light emitting device will automatically fail whenever over current or over voltage occurs and thus be prevented from explosion and fire.

8 Claims, 5 Drawing Sheets

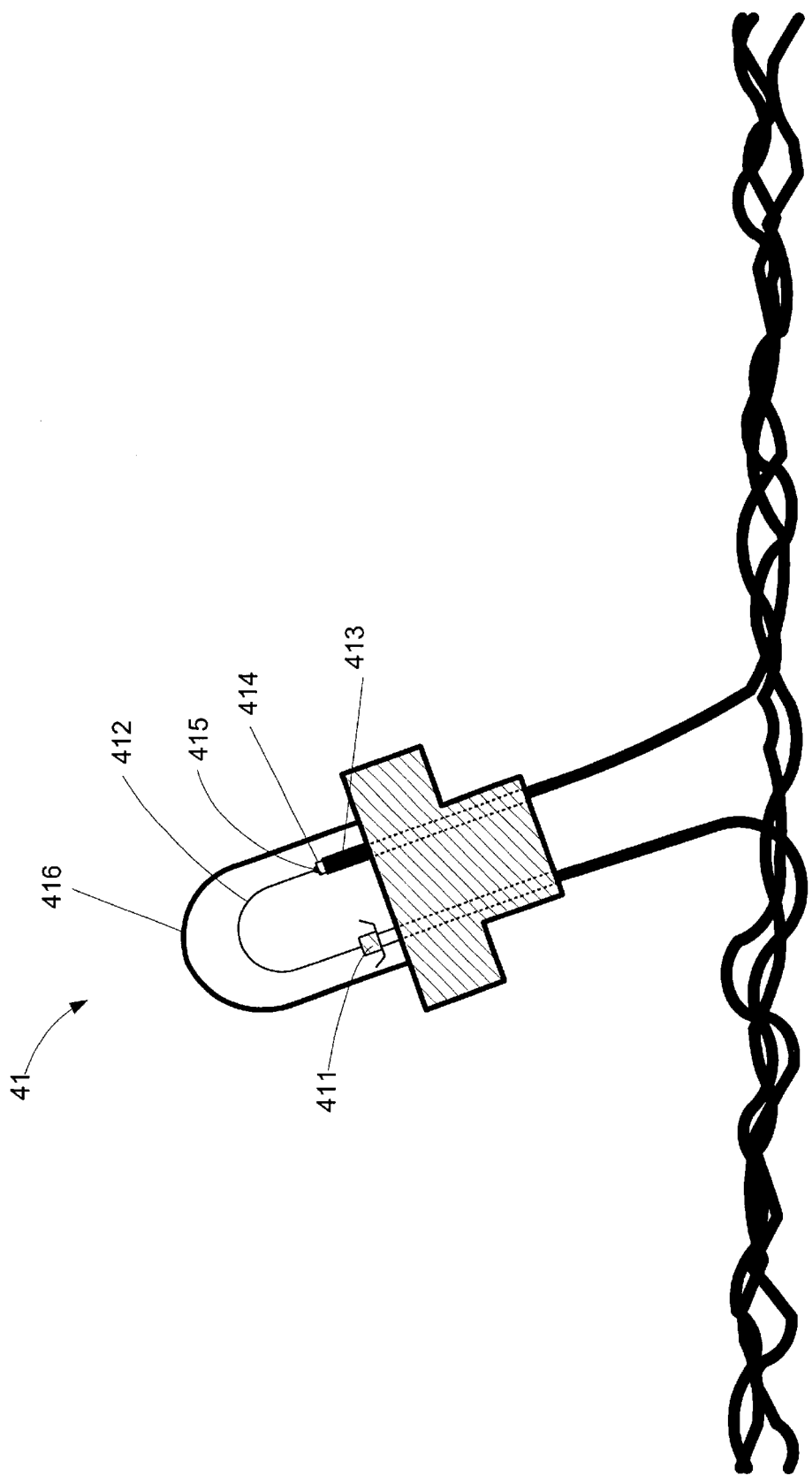

SAFE LIGHT EMITTING DEVICE

FIELD OF THE INVENTION

The present invention relates to a light emitting device and more particularly, to a safe light emitting device that can avoid fire when either over voltage or over current occurs.

BACKGROUND OF THE INVENTION

A light emitting diode lamp meets the requirement of energy saving and is widely applied in replace of traditional incandescent lamps. A series light emitting device that includes a plurality of light emitting diode lamps in series used as Christmas light sets is one of the applications of the light emitting diodes.

FIG. 1 depicts a traditional series light emitting device 10 such as a series of decorative lights of a Christmas tree. The light emitting device 10 includes several light emitting diode lamps, i.e. lamps 11 to 14, which are connected in series. Such a light emitting device 10 can be found in U.S. Pat. No. 5,931,570.

The traditional light emitting device 10 is susceptible to either over current or over voltage and may lead to explosion of light emitting diode lamp, if the light emitting diodes break down one by one. The situation could be very dangerous because the explosion and fire would harm people and even damage property. Such shortcomings of the traditional light emitting device 10 mainly come from the characteristics of the power source and the light emitting diode lamps.

The power source from such as a household socket provides a so-called line voltage that has about 15% of fluctuation in voltage and is current-unlimited. This often leads to over voltage and over current.

Furthermore, the characteristic of the light emitting diode lamps worsens the situation. Please refer to FIGS. 2 and 3 for more detailed description of why the characteristic of the light emitting diode lamps would worsen the situation. FIG. 2 depicts the light emitting diode lamp 11 that exemplifies all the light emitting diode lamps 12 to 14 of the traditional light emitting device 10. The light emitting diode lamp 11 generally includes elements of a light emitting diode chip 111, a bonding wire 112 and a lead frame 113. The elements 111, 112 and 113 are encapsulated in a lamp cap 116 made of epoxy material which may explode if over heated abruptly.

FIG. 3 depicts schematically a current to voltage characteristic chart of a light emitting diode lamp. In a normal operation region A, the current of the light emitting diode lamp increases linearly similar to Ohm's law as the voltage increases. However, in the region B when over voltage occurs, the current jumps dramatically to an unbearable high that increases the temperature of the lamp. If the temperature increasing rate is moderate, the light emitting diode chip will break down. The impedance of the light emitting diode chip will drop down as it broke down. As the light emitting diode break down, the lamp behaves as a conductor, which means the load of the voltage would be added to the unbroken-down LED lamp(s). The added load burdens the unbroken-down LED lamp(s) and even increases the current. Consequently, the other lamp(s) are more susceptible to break down. Accordingly, the driving current in light emitting device 10 will increase step by step when the light emitting diode lamps break down one by one. Finally, the last unbroken-down LED lamp will be subjected to almost all the voltage load of the device 10. The lamp cap of the final LED lamp would explode and cause spark which may result in fire. That would be extremely dangerous.

Therefore, there exists a need to overcome the shortcomings of the traditional series light emitting device.

SUMMARY OF THE INVENTION

The present invention provides a safe series light emitting device that can avoid explosion and fire when either over voltage or over current occurs. The light emitting device of the present invention includes a plurality of light emitting diode lamps in series. In the light emitting device, at least one of the light emitting diode lamps is a safe light emitting diode lamp. The safe light emitting diode lamp results in an open circuit when either over current or over voltage in the light emitting device occurs. As a result, the light emitting device would automatically fail before danger of explosion and fire might occur.

Preferably, the safe light emitting diode lamp includes a chip type resistor or similar device that would result in a broken circuit and disconnect the series lamps when either over voltage or over current in the light emitting device occurs. The chip type resistor is preferably disposed between a light emitting diode chip and a lead frame of the safe light emitting diode lamp.

Advantages and spirit of the present invention can be further understood by the following detailed description of the invention and drawings.

BRIEF DESCRIPTION OF THE DRAWINGS

FIG. 5 depicts a safe light emitting diode lamp in the light emitting device of FIG. 4.

DETAILED DESCRIPTION OF THE INVENTION

Figure 1:
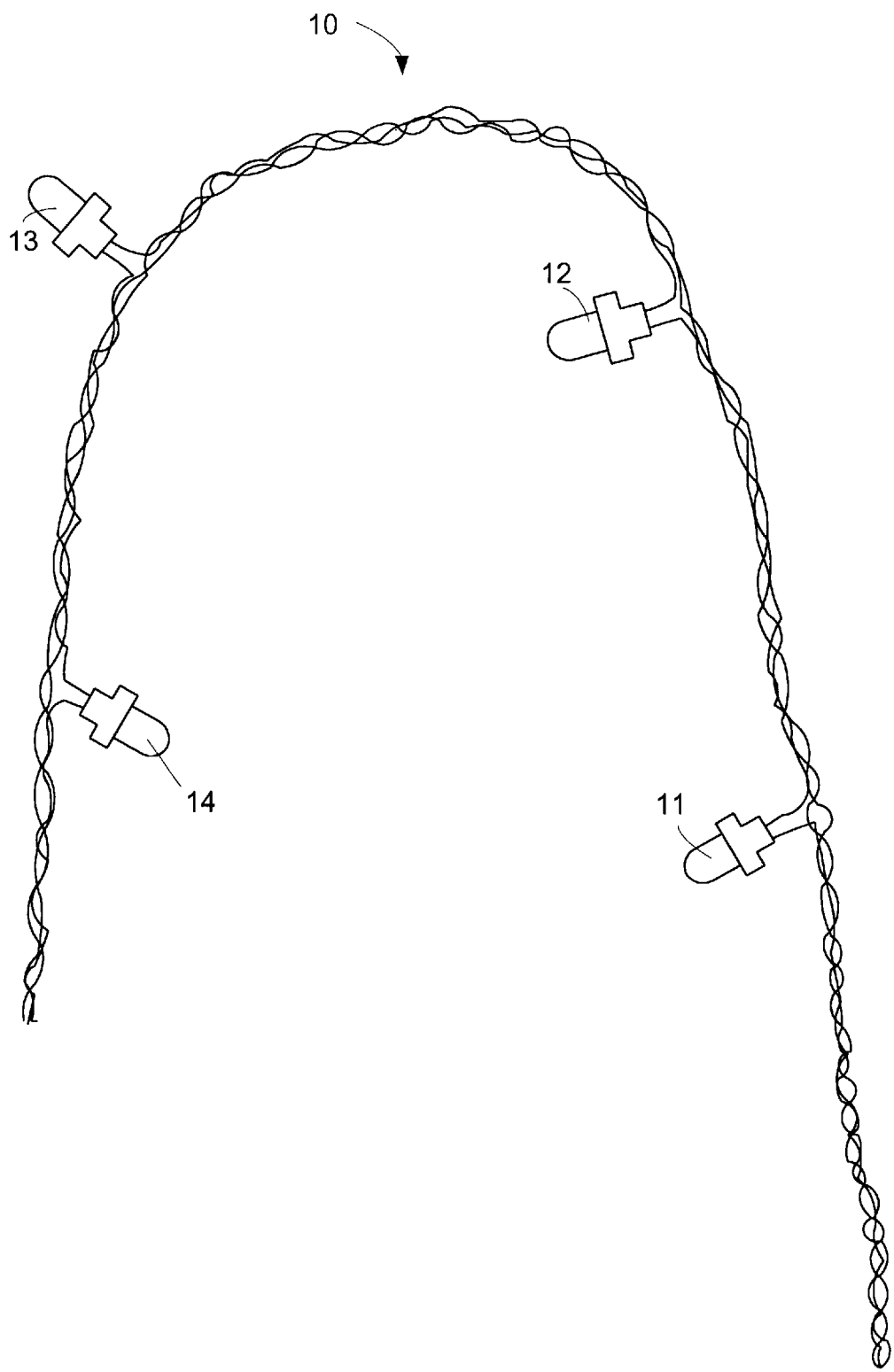
FIG. 1 depicts a conventional light emitting device.
Figure 2:
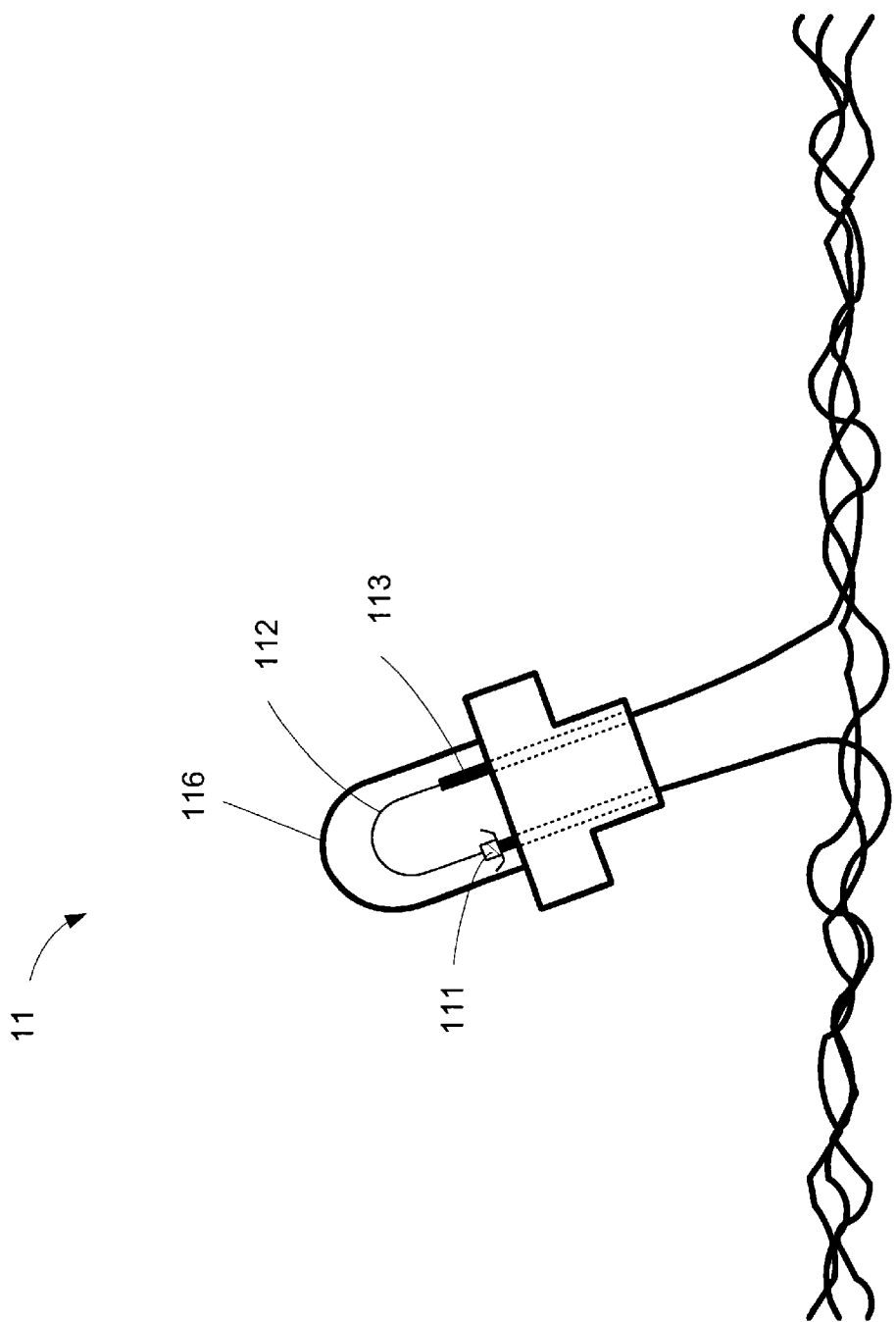
FIG. 2 depicts a light emitting diode lamp in the conventional light emitting device of FIG. 1.
Figure 3:
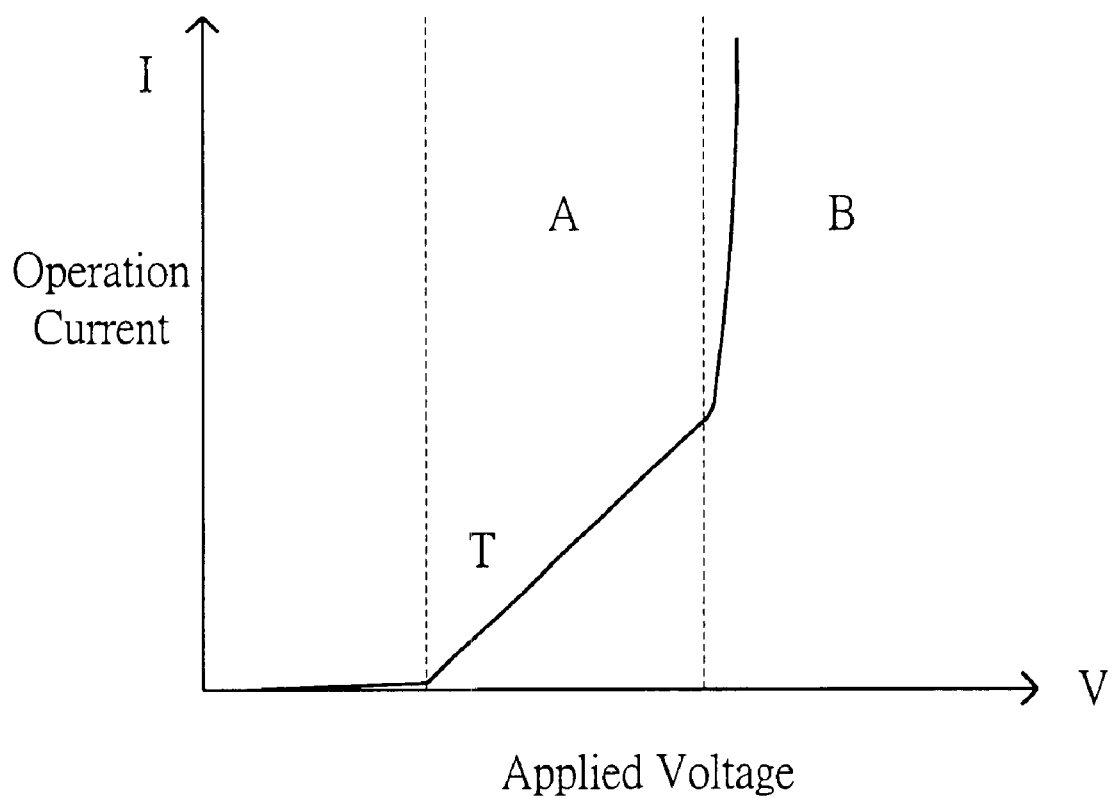
FIG. 3 depicts schematically a current to voltage characteristic chart of a light emitting diode lamp.
Figure 4:
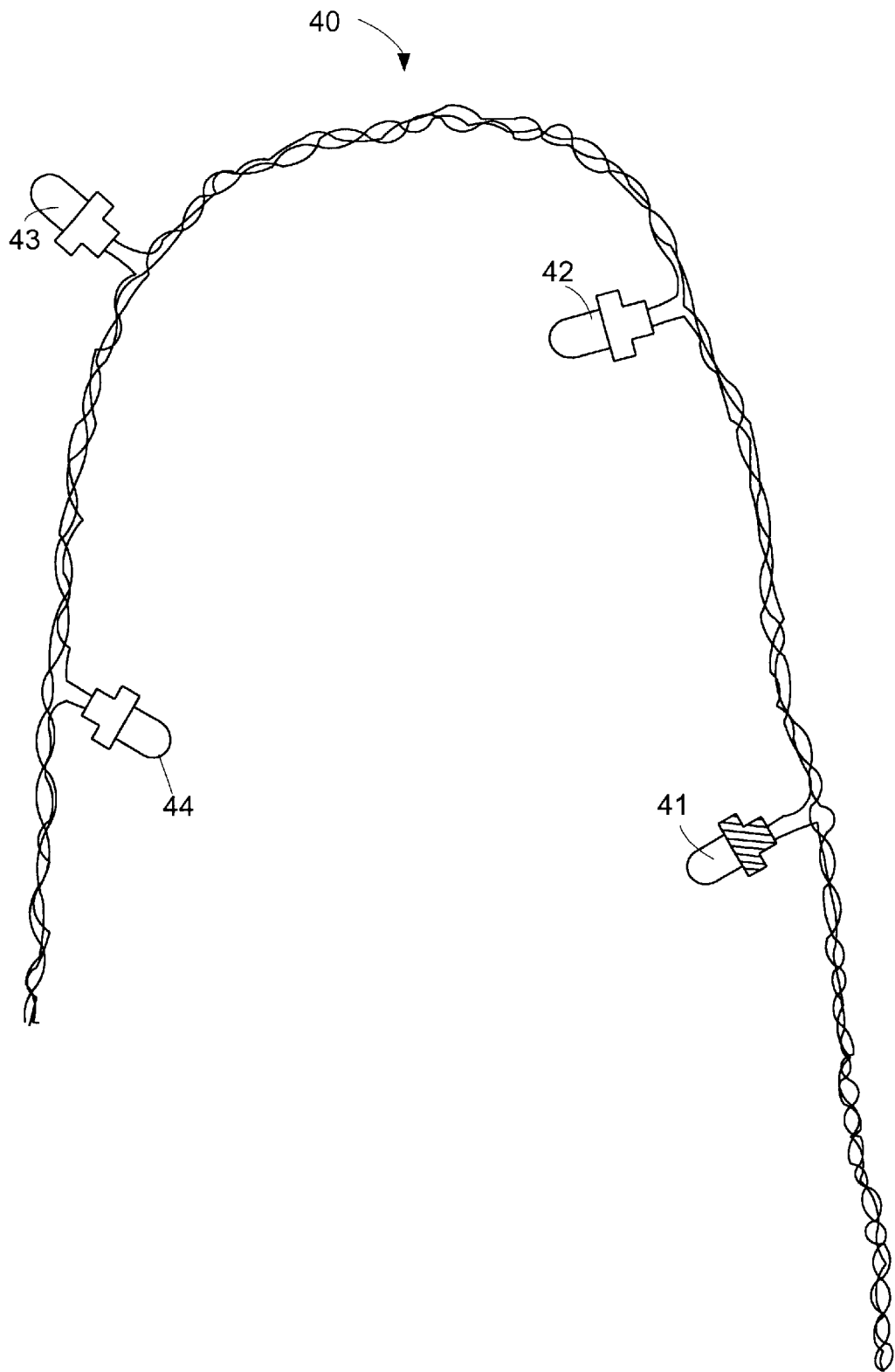
FIG. 4 depicts a light emitting device according to the present invention.

Please refer to FIG. 4. The present invention provides a light emitting device 40. The light emitting device 40 includes several light emitting diode lamps 42, 43, and 44, which are connected in series. The light emitting device 40 further includes a safe light emitting diode lamp 41, which will result in a open circuit and fail the light emitting device 40 whenever over voltage or over current occurs.

Apparently, the light emitting device 40 of the present invention may include one or more safe light emitting diode lamp(s) being incorporated in any random position of the series, as long as the safe light emitting diode lamp(s) provides a safe mechanism that would automatically fail the electrical connection of the series light emitting diode lamps.

Please refer to FIG. 5, which in detail depicts a safe light emitting diode lamp 41 according to a preferred embodiment of the present invention. The safe light emitting diode lamp 41 includes a chip type resistor or similar device 414. The chip type resistor 414, as known to persons skilled in the art, will generate heat locally and thus result in a broken circuit when the driving current exceeds a certain limit. The chip type resistor can be incorporated in the package of LED lamp without increasing the size.

In the safe light emitting diode lamp 41, the chip type resistor 414 is preferably disposed between a light emitting diode chip 411 and a lead frame 413. Furthermore, the chip type resistor 414 is preferably bonded on the opposite lead of the lead frame 413 and connected to the light emitting diode chip 411 via a bonding wire 412 that is disposed between the light emitting diode chip 411 and the chip type resistor 414. More specifically, the bonding wire 412 is connected to a bonding pad 415 of the chip type resistor 414, as shown in FIG. 5. The light emitting diode chip 411, the bonding wire 412, partly the lead frame 413, and the chip type resistor 414 are encapsulated in a lamp cap 416.

When either over current or over voltage occurs, the chip type resistor 414 will generate high heat locally. When the temperature exceeds a tolerance limit, the chip type resistor 414 will disconnect the bonding wire 412 or be failed by itself Accordingly, the light emitting diode lamp 41 failed and became open in circuit. Since the light emitting diode lamps 41 to 44 are series connected, the disconnection of the bonding wire 412 and the lead frame 413 will disconnect the series lamps 41 to 44. Therefore, the light emitting device 40 is failed. There is not a chance for the explosion and fire to occur.

Through the incorporation of the safe light emitting diode lamp(s), the present invention can prevent the series light emitting device from explosion and fire by automatically being failed when the temperature exceeds a tolerance limit, which is mostly caused by over voltage or over current.

Besides, the driving current of the light emitting device from the present invention will also be more stable due to the existence of the extra chip resistance in the safe light emitting diode lamps. The chip type resistor can withstand part of voltage load. The voltage drop across the chip type resistor increases as the current increases and this will prevent continuous increase of current.

The above detailed description is to clearly describe features and spirit of the present invention and is not intended to limit the scope of the present invention. Various changes and equivalent modifications should be covered by the invention. Therefore, the scope of the present invention should be interpreted based on the following claims together with the above descriptions in the broadest way.

What is claimed is:

1. A light emitting device including a plurality of light emitting diode lamps in series; wherein at least one of the light emitting diode lamps is a safe light emitting diode lamp, said safe light emitting diode lamp comprising;

a light emitting diode chip;

a lead frame; and a chip type resistor, said chip type resistor being disposed between said light emitting diode chip and said lead frame;

whereby said safe light emitting diode lamp is configured to provide a broken circuit when either over current or over voltage in said light emitting device occurs.

2. The light emitting device of claim 1, wherein the chip type resistor results in a broken circuit when either over voltage or over current in the light emitting device occurs.

3. The light emitting device of claim 1, wherein the safe light emitting diode lamp further comprises a bonding wire between the light emitting diode chip and type resistor.

4. The light emitting device of claim 1, wherein said chip type resistor is configured to withstand a voltage drop to said light emitting device to provide surge protection.

5. The light emitting device of claim 1, wherein said chip type resistor is configured to restrict the temperature of said chip type resistor by a tolerance temperature limit.

6. A light emitting device including a plurality of light emitting diode lamps in series; wherein at least one of the light emitting diode lamps is a safe light emitting diode lamp, said safe light emitting diode lamp comprising:

a light emitting diode chip;

a lead frame;

a chip type resistor, said chip type resistor being disposed between said light emitting diode chip and said lead frame; and a bonding wire between said light emitting diode chip and said chip type resistor, said chip type resistor being connected to said light emitting diode chip via said bonding wire;

whereby said safe light emitting diode lamp is configured to provide a broken circuit when either over current or over voltage in said light emitting device occurs.

7. The light emitting device of claim 6, wherein said chip type resistor is configured to provide a broken circuit when either over voltage or over current in the light emitting device occurs.

8. The light emitting device of claim 6, wherein said chip type resistor is configured to withstand a voltage drop to said light emitting device to provide surge protection.

* * * * *